(12) United States Patent
Fujiwara et al.

(10) Patent No.: US 10,943,667 B2
(45) Date of Patent: Mar. 9, 2021

(54) MEMORY DEVICE

(71) Applicant: Taiwan Semiconductor Manufacturing Company, Ltd., Hsinchu (TW)

(72) Inventors: Hidehiro Fujiwara, Hsinchu (TW); Hsien-Yu Pan, Hsinchu (TW); Chih-Yu Lin, Taichung (TW); Yen-Huei Chen, Hsinchu County (TW); Hiroki Noguchi, Hsinchu (TW); Wei-Chang Zhao, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/657,284

(22) Filed: Oct. 18, 2019

(65) Prior Publication Data

US 2020/0135288 A1 Apr. 30, 2020

Related U.S. Application Data

(60) Provisional application No. 62/751,841, filed on Oct. 29, 2018.

(51) Int. Cl.
| | | |
|---|---|---|
| *G11C 19/28* | (2006.01) | |
| *G11C 8/08* | (2006.01) | |
| *G11C 7/22* | (2006.01) | |
| *G11C 7/10* | (2006.01) | |

(52) U.S. Cl.
CPC .......... *G11C 19/287* (2013.01); *G11C 7/1063* (2013.01); *G11C 7/1096* (2013.01); *G11C 7/222* (2013.01); *G11C 8/08* (2013.01)

(58) Field of Classification Search
CPC ......... G11C 19/287; G11C 8/08; G11C 7/222; G11C 7/1063; G11C 7/1096; G11C 11/418; G11C 8/04; G11C 7/1093; G11C 7/1066; G11C 7/1069
USPC .......................................... 365/78
See application file for complete search history.

(56) References Cited

U.S. PATENT DOCUMENTS

| | | | |
|---|---|---|---|
| 7,051,153 B1 | 5/2006 | Lin et al. | |
| 10,670,915 B2 * | 6/2020 | Suzuki | ................ G09G 3/3648 |
| 2009/0122629 A1 * | 5/2009 | Warner | .................... G11C 7/12 |
| | | | 365/203 |
| 2017/0221904 A1 * | 8/2017 | Liaw | ..................... H01L 23/528 |
| 2018/0158518 A1 * | 6/2018 | Shu | ....................... G11C 7/1006 |
| 2019/0221288 A1 * | 7/2019 | Minati | ................ G06F 13/4282 |

* cited by examiner

*Primary Examiner* — Fernando Hidalgo
(74) *Attorney, Agent, or Firm* — Merchant & Gould P.C.

(57) ABSTRACT

A memory device is provided. The memory device includes a shift register array having a plurality of shift registers arranged in a matrix of a plurality of rows and a plurality of columns. Each of the plurality of rows comprises a first plurality of shift registers and each of the plurality of columns comprises a second plurality of shift registers. Each of the plurality of rows are associated with a read word line and a write word lines. Each of the plurality of rows are associated with a data input line and a data output line. Each of the plurality of shift arrays comprises a static random access memory.

20 Claims, 8 Drawing Sheets

MEMORY DEVICE

PRIORITY CLAIM AND CROSS-REFERENCE

This application claims priority to U.S. Provisional Patent Application No. 62/751,841 titled "MEMORY DEVICE FOR LEARNING APPLICATION" filed Oct. 29, 2018, the disclosure of which is hereby incorporated by reference in its entirety.

BACKGROUND

In general, artificial intelligence (AI) is driven by advancement in machine learning methodologies. The logic algorithms of machine learning algorithms are generally executed in parallel using multiple processors. For example, the training process in machine learning includes matrix multiplication, which is a simple but broad task performed by multiple processors in parallel. Each of these processors use memory, such as a shift registers, to store data for execution of the logic algorithms. These memories are data flip flops or static random access memories, for example. However, cell size of the data flip flops tends to be large and clocks used to operate these data flip flops consume relatively large amounts of power. Moreover, static random access memory devices also occupy significant space.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
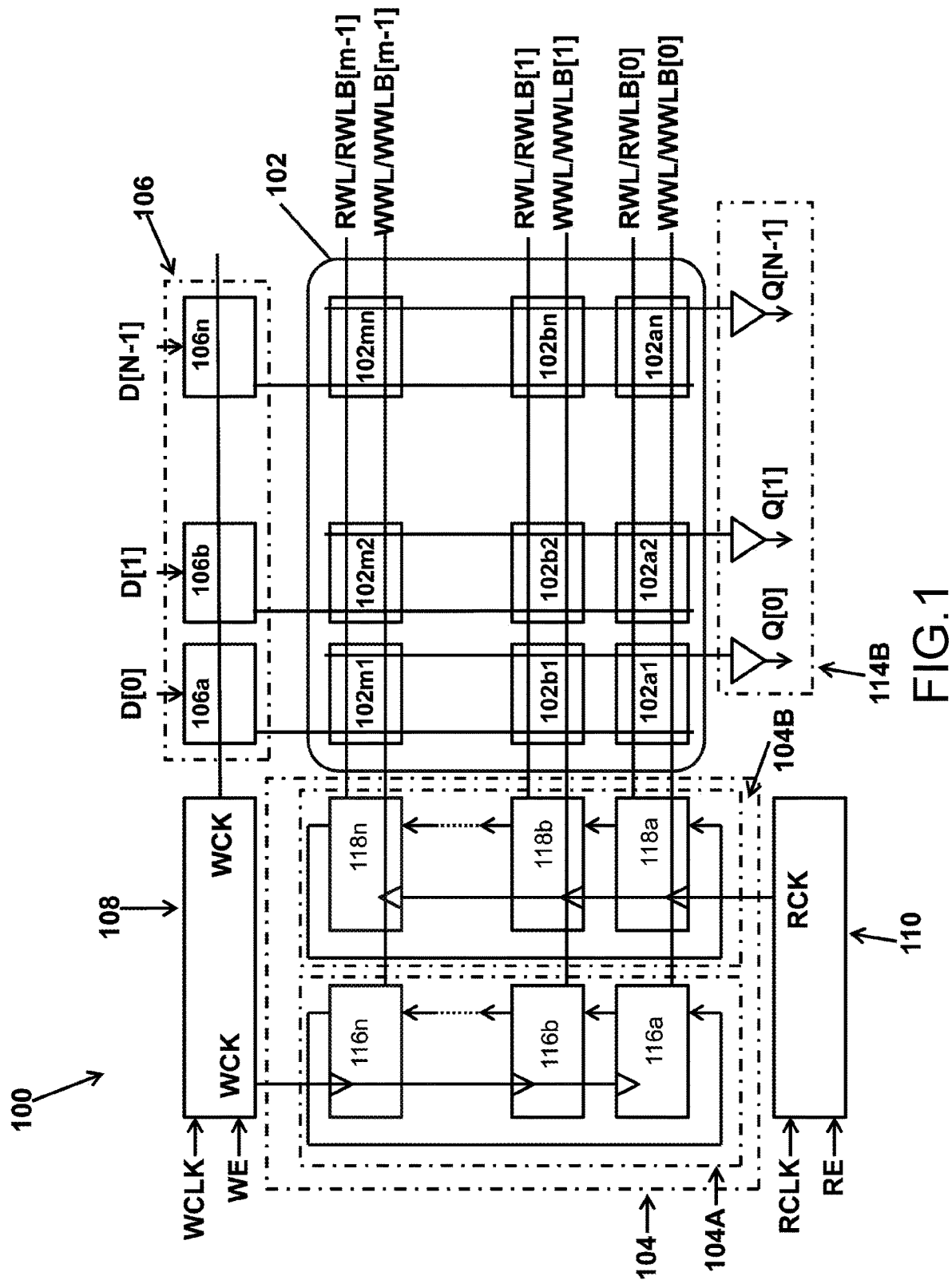
FIG. 1 depicts an example memory device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a memory device 100 in accordance with aspects of the present disclosure. Memory device 100 may be a shift register array. As shown in FIG. 1, memory device 100 includes a shift register array 102, a driver circuit 104, a data input circuit 106, a first clock circuit 108, a second clock circuit 110, and a data output circuit 114. Shift register array 102 may include a plurality of shift registers 102$a$1, 102$a$2, . . . , 102$mn$.

Continuing with FIG. 1, plurality of shift registers of shift register array 102 are arranged in a matrix of m rows and n columns. Each of the m rows include a first plurality of shift registers and each of the n columns include a second plurality of shift registers. For example, a first row may include a first plurality of shift registers designated as 102$a$1, 102$a$2, . . . , 102$an$. Similarly, a second row may include a first plurality of shift registers designated 102$b$1, 102$b$2, . . . , 102$bn$, and each row may continue to the m$^{th}$ row where the shift registers may be designated 102$m$1, 102$m$2, . . . , and 102$mn$. A number of rows and columns in shift registers array 102 may depend on a size of memory device 100.

Each shift registers of a row of shift register array 102 is connected to a Read Word Line/Read Word Line Bar (RWL/RWLB) and a Write Word Line/Write Word Line Bar (WWL/WWLB). For example, each of shift registers 102$a$1, 102$a$2, . . . , 102$an$ of the first row is connected to RWL/RWLB[0] and WWL/WWLB[0]. Similarly, each of shift registers 102$b$1, 102$b$2, . . . , 102$bn$ of the second row is connected to RWL/RWLB[1] and WWL/WWLB[1]. Lastly, each shift registers 102$m$1, 102$m$2, . . . , 102$mn$ in the m$^{th}$ row is connected to RWL/RWLB[m−1] and WWL/WWLB[m−1].

WWL/WWLB and RWL/RWLB (also referred to as word lines) control access to shift registers in respective rows. For example, WWL/WWLB[0]and RWL/RWLB[0]control access to shift registers 102$a$1, 102$a$2, . . . , 102$an$ of the first row. That is, to write data to shift registers 102$a$1, 102$a$2, . . . , 102$an$, WWL/WWLB[0]is charged to a logic high. And, to read data to shift registers 102$a$1, 102$a$2, . . . , 102$an$, RWL/RWLB[0] is charged to a logic high.

In addition, the second plurality of shift registers in each of the n columns of shift register array 102 are connected to a bit line pair. For example, a second plurality of shift registers of a first column, designated as 102*a*1, 102*b*1, . . . , 102*m*1, are connected to a first bit line pair. Similarly, a second plurality of shift registers of a second column, designated as 102*a*2, 102*b*2, . . . , 112*m*2, are connected to a second bit line pair, and so on. In examples, a first bit line of a bit line pair is used for writing data into shift registers (also referred to as data input or D) and a second bit line of the bit line pair is used for reading data from shift registers (also referred to as data output or Q).

In example embodiments, each plurality of shift registers of shift register array 102 may include a SRAM cell. The SRAM cell for the shift registers may be include ten transistors (10T) SRAM or a twelve transistors (12T) SRAM. However, other configurations are also foreseeable. For example, plurality of shift registers may include four transistors (4T) SRAMS, six transistors (6T) SRAMS, or eight transistors (8T) SRAMS.

Figure 2A:
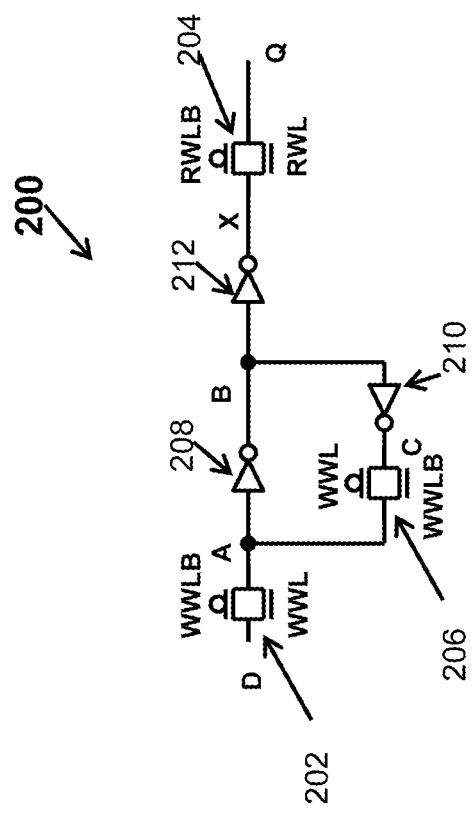
FIG. 2A depicts an example 12T cell in accordance with some embodiments.

FIG. 2A depicts an example 12T SRAM shift register 200 in accordance with some embodiments. As shown in FIG. 2A, 12T SRAM shift register 200 includes a first transmission gate 202, a second transmission gate 204, a third transmission gate 206, a first invertor 208, a second invertor 210, and a third invertor 212. Each of first transmission gate 202, second transmission gate 204, third transmission gate 206, first invertor 208, second invertor 210, and third invertor 212 include two transistors.

First transmission gate 202 is connected between an input node D and an internal node A. Second transmission gate 204 is connected between an internal node X and an output node Q. Third transmission gate 206 is connected between the internal nice A and an internal node C. First invertor 208 is connected between the internal node A and an internal node B. Second invertor 210 is connected between the internal node B and the internal node C. Third invertor 212 is connected between the internal node B and the internal node X. First invertor 208 and second invertor 210 form a cross-couple invertor circuit between the internal node A and the internal node B. The cross-coupled invertor circuit can store one bit of information (that is bit 0 or 1).

During operation, when WWL is at a logic high (i.e., logic 1), first transmission gate 202 is open, thus connecting the input node D to the internal node A, thereby writing data into 12T SRAM shift register 200. In addition, when WWL is at a logic high, second transmission gate 212 is closed, thus disconnecting the internal node C from the internal node A. Similarly, when RWL is at a logic high (i.e., logic 1), third transmission gate 206 is open, thus connecting the internal node X to the output node Q, thereby reading data from 12T SRAM shift register 200. Moreover, when both WWL and RWL are at a logic low, then data is retained in 12T SRAM shift register 200.

Figure 2B:
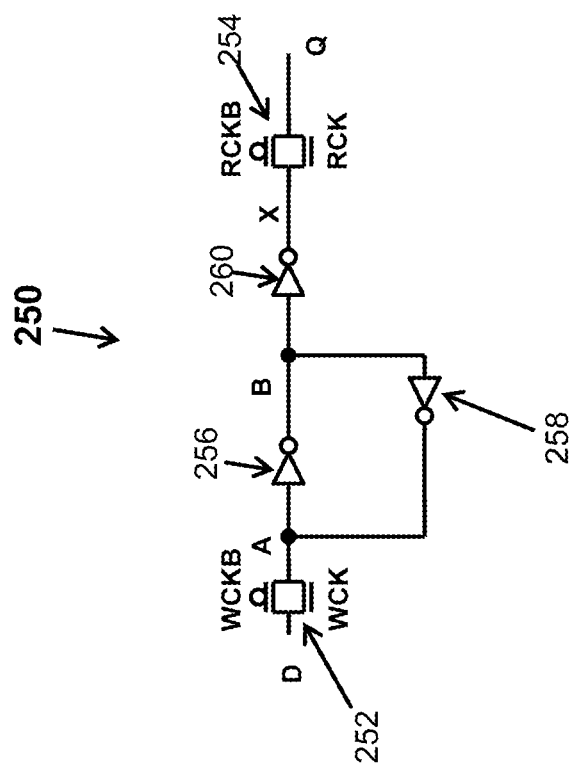
FIG. 2B depicts an example 10T cell in accordance with some embodiments.

FIG. 2B depicts an example 10T SRAM shift register 250 in accordance with some embodiments. As shown in FIG. 2B, 10T SRAM shift register 250 includes a first transmission gate 252, a second transmission gate 254, a first invertor 256, a second invertor 258, and a third invertor 260. Each of first transmission gate 252, second transmission gate 254, first invertor 256, second invertor 258, and third invertor 260 include two transistors.

First transmission gate 252 is connected between an input node D and an internal node A. Second transmission gate 254 is connected between an internal node X and an output node Q. First invertor 256 is connected between the internal node A and an internal node B. Second invertor 258 is connected between the internal node B and the internal node A. Third invertor 260 is connected between the internal node B and the internal node X. First invertor 256 and second invertor 258 form a cross-couple invertor circuit between the internal node A and the internal node B.

During operation, when WCK is at a logic high (i.e., logic 1), first transmission gate 252 is open, thus connecting the input node D to the internal node A, thereby writing data into 10T SRAM shift register 250. In addition, when RCK is at a logic high (i.e., logic 1), second transmission gate 254 is open, thus connecting the internal node X to the output node Q, thereby reading data from 10T SRAM shift register 250. Moreover, when both WCK and RCK are at a logic low, then data is retained in 10T SRAM shift register 250.

Returning to FIG. 1, driver circuit 104 may include a write driver circuit 104A and a read driver circuit 104B. Write driver circuit 104A is operative to select one of the plurality of WWL/WWLB and charge it to a logic high (that is, logic 1). Similarly, read driver circuit 104B is operative to select one of the plurality of RWL/RWLB and charge it to a logic high.

Write driver circuit 104A includes a first cascade of a first plurality of flip flops (designated as 116*a*, 116*b*, . . . , 116*n*). For example, write driver circuit 104A includes a first cascade of a first plurality of D flip-flops forming a circuit (that is a shift register) that shifts by one position at each transition of the clock input. The D flip-flop is known as a delay flip-flop (as its output Q looks like a delay of input D) or data latch. The first cascade of write driver circuit 104A may include other types of flip-flops, for example, the RS ("set-reset"), D ("data" or "delay"), T ("toggle"), and JK flip-flops. In example embodiments, a number of first plurality of flip-flops of first cascade is equal to a number of rows of shift register array 102, each of the first plurality of flip-flops being associated with a correspond row of shift register array 102.

Figure 3:
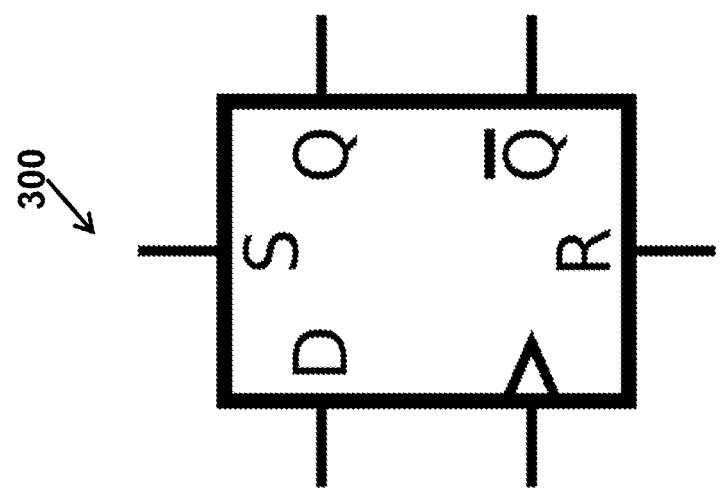
FIG. 3 depicts an example D-type flip-flop with a shared clock terminal and one output in accordance with some embodiments.

FIG. 3 illustrates an example of a D flip-flop 300 that may be used in driver circuit 104. D flip-300 flop captures the value of the D-input at a definite portion of the clock cycle (such as the rising edge of the clock). That captured value becomes the Q output. At other times, the output Q does not change. D flip-flop 300 can be viewed as a memory cell, a zero-order hold, or a delay line. In this example a single data output terminal, Q, is provided along with a single data input terminal, D, and a clock input terminal, CK in. With some D flip-flops 300, two output terminals, Q and Q-bar are provided along with a single input terminal, D, and a clock input terminal, CK in. Additionally in the illustrated example, two terminals, set S and reset R, are added to set and reset the flip-flop via the S and R terminals, respectively.

Referring back to FIG. 1, each of the first plurality of D flip-flops share a same clock signal, that is, a WCK signal generated by first clock circuit 108. The Q node of one flip-flop is connected to a D node of a next flip-flop in the first cascade. The Q node of a last flip-flop is connected to the D node of the first flip-flop. The first plurality of D flip-flops may include asynchronous reset. For example, the first plurality of D flip-flops have a "reset" signal input, which will reset Q (to zero), and may be either asynchronous or synchronous with the clock.

In addition, read driver circuit 104B includes a second cascade of a second plurality of flip-flops (designated as 118*a*, 118*b*, . . . , 118*n*). For example, read driver circuit 104B includes a second cascade of a second plurality of D flip-flops forming a circuit (that is a shift register) that shifts by one position at each transition of the clock input. Each of the second plurality of D flip-flops share a same clock signal, that is, a RCK signal generated by second clock circuit 110. The Q node of one flip-flop is connected to a D node of a next flip-flop in the first cascade. The Q node of a last flip-flop is connected to the D node of the first flip-flop.

The second plurality of flip-flops may also include data flip-flops with asynchronous reset. For example, the second plurality of flip-flops have a "reset" signal input, which resets Q (to zero), and may be either asynchronous or synchronous with the clock. A number of the first plurality of flip-flops may be equal to a number of the second plurality of flip-flops. In examples, each flip-flop of the first plurality of flip-flops may be associated with a respective WWL/WWLB. Similarly, each flip-flop of the second plurality of flip-flops may be associated with a respective RWL/RWLB.

The first plurality of flip-flops of write driver circuit 104A are enabled by a write enable (WE) signal and are shifted by a first clock (also referred to as a write clock (WCLK)) signal of first clock circuit 108 (also referred to as a write clock circuit 108). For example, an output of first clock circuit 108 (that is, the WCK signal) is connected to clock input nodes of each of the first plurality of flip-flops of the first cascade. With rising edge of the WCLK signal, each flip-flop is shifted out, thus, selecting and charging an associated WWL/WWLB to logic high, enabling writing of data in shift register array 102. A timing diagram associated with write operation is described with reference to FIG. 4B.

The second plurality of flip-flops of read driver circuit 104B are enabled by a read enable (RE) signal and are shifted by a second clock signal (also referred to as a read clock (RCLK)) signal of second clock circuit 110 (also referred to as a read clock circuit 110). For example, an output of second clock circuit 110 (that is, the RCK signal) is connected to clock input nodes of each of the second plurality of flip-flops of the second cascade. With rising edge of the RCK signal, each flip-flop is shifted out, thus, selecting and charging an associated RWL/RWLB to logic high. A timing diagram associated with read operation is described with reference to FIG. 4B.

Continuing with FIG. 1, memory device 100 includes data input circuit 106. In example embodiments, data input circuit 106 is a latch. Data input circuit 106 includes a third plurality of flip-flops (designated as 106a, 106b, ..., 106n). Each of the third plurality of flip-flops may be associated with a data input line (designated as D[0], D[1], ....D[N−1]) and with a respective column of shift register array 102. For example, first flip-flop 106a of data input circuit 106 is connected to a first input line D[0] and is associated with a first column of shift register array 102. That is, an output of first flip-flop 106a of data input circuit 106 is connected to an input node D of each of the first plurality of shift registers of the first column (designated as 102a1, 102b1, ..., 102m1) of shift register array 102. Similarly, second flip-flop 106b of data input circuit 106 is connected to a second input line D[1] and is associated with a second column of shift register array 102. That is, an output of second flip-flop 106b of data input circuit 106 is connected to an input node D of each of the first plurality of shift registers of the second column (designated as 102a2, 102b2, ..., 102m2) of shift register array 102. Continuing to nth flip-flop 106n of data input circuit 106 which is connected to a nth input line D[N−1] and is associated with a nth column of shift register array 102. That is, an output of nth flip-flop 106n of data input circuit 106 is connected to an input node D of each of the first plurality of shift registers of the nth column (designated as 102an, 102bn, ..., 102mn) of shift register array 102.

Figure 2C:
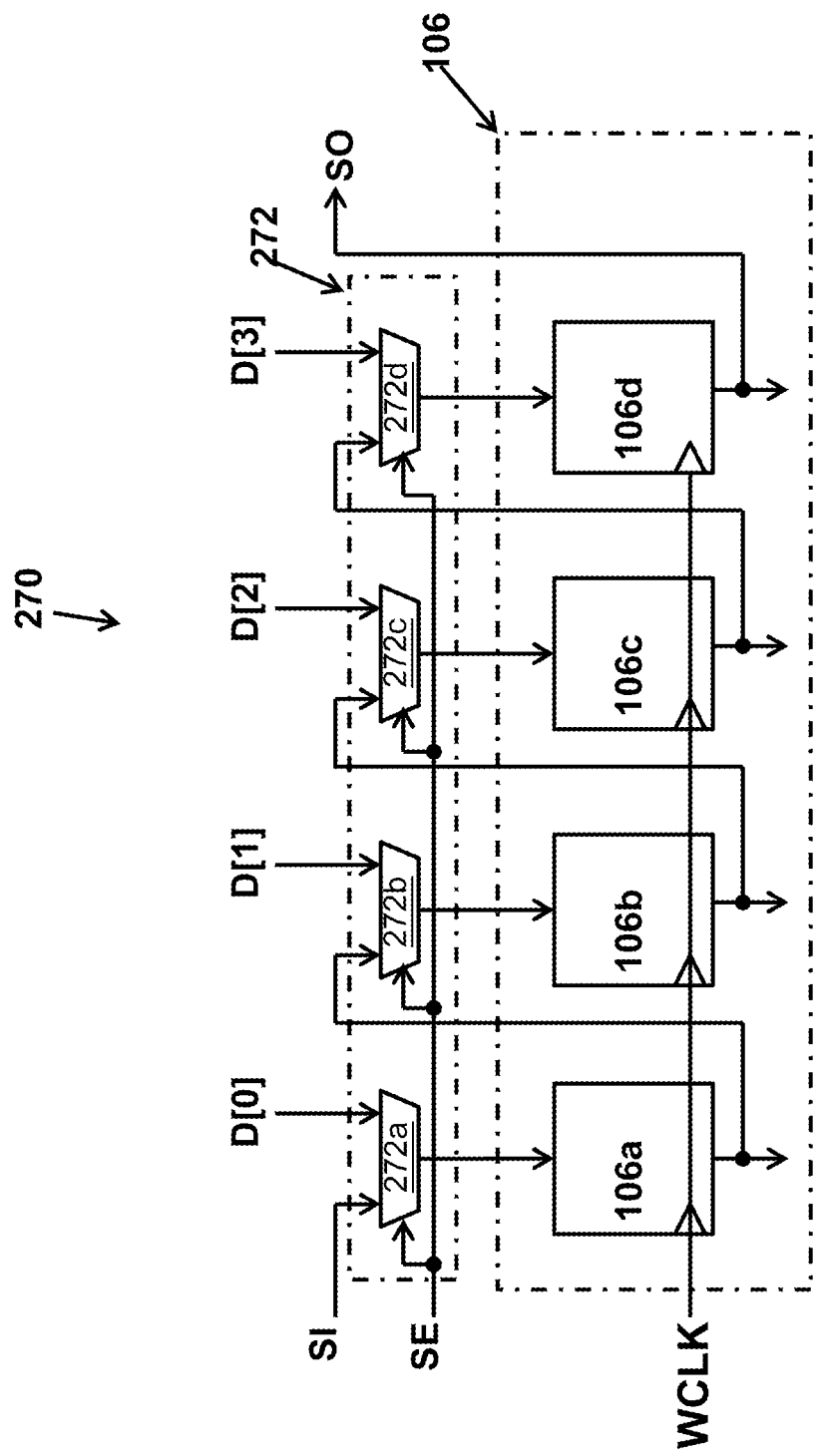
FIG. 2C is a diagram illustrating an example sharing of input circuit of a memory device in accordance with some embodiments.

In example embodiments, the third plurality of flip-flops of data input circuit 106 of memory device 100 can be shared. For example, the third plurality of flip-flops of data input circuit 106 can be shared with a design for test (DFT) circuit. FIG. 2C is a diagram 270 illustrating an example of sharing of the third plurality of flip-flops of data input circuit 106 of memory device 100. As shown in FIG. 2C, diagram 270 includes data input circuit 106 which includes the third plurality of flip-flops (designated as 106a, 106b, 106c, and 106d) and a plurality of multiplexers 272 (individually designated as 272a, 272b, 272c, and 272c). Each multiplexer of plurality of multiplexers 272 is associated with one flip-flip of the third plurality of flip-flops of data input circuit 106.

For example, first flip-flop 106a of data input circuit 106 is associated with a first multiplexer 272a, second flip-flop 106b of data input circuit 106 is associated with a second multiplexer 272b, third flip-flop 106c of data input circuit 106 is associated with a third multiplexer 272c, and fourth flip-flop 106d of data input circuit 106 is associated with a fourth multiplexer 272d. Although diagram 760 is shown to include four multiplexers and four flip-flops, it will be apparent to a person with skill in the art after reading this disclosure that a different number of multiplexers and a different number of flip-flops are within the scope of the disclosure.

Each of plurality of multiplexers 272 is enabled by a scan enable (SE) signal. In addition, each of plurality of multiplexers 272 includes two inputs and one output. For example, first multiplexer 272a includes scan input (SI) signal as a first input and a first input data line D[0] as a second input. The output of first multiplexer 272a is provided as an input to first flip-flop 106a of data input circuit 106. Second multiplexer 272b includes the output of first flip-flip 106a as a first input and a second input data line D[1] as a second input. The output of second multiplexer 272b is provided as an input to second flip-flop 106b of data input circuit 106. In addition, third multiplexer 272c includes the output of second flip-flop 106b as a first input and a third input data line D[2] as a second input. The output of third multiplexer 272c is provided as an input to third flip-flop 106c of data input circuit 106. Moreover, fourth multiplexer 272d includes the output of third flip-flip 106c as a first input and a fourth input data line D[3] as a second input. The output of fourth multiplexer 272d is provided as an output signal (that is, a scan output or SO) of the design for test circuit.

During operation, when the SE signal is at a logic value low, the third plurality of flip-flops are configured to provide input to shift register array 102. In addition, when the SE signal is at a logic value high, the third plurality of flip-flops of data input circuit 106 are configured to as a scan chain for the design for test circuit. In the scan chain configuration, the SI signal become an input for a first flip-flop 106a. An output from first flip-flop 106a becomes an input for second flip-flop 106b. In addition, an output from second flip-flop 106b becomes an input for third flip-flop 106c. Moreover, an output from third flip-flop 106c becomes an input for fourth flip-flop 106d. An output of fourth flip-flop an output (that is, SO signal) of the scan chain.

Referring back to FIG. 1, during operation, the input data stored in data input circuit 106 (that is, the third plurality of flip-flops) is provided to shift register array 102 via input nodes. In example embodiments, the third plurality of flip-flops are enabled and are shifted by the WCK signal of first clock circuit 108. However, another latch is not required for data output circuit 114. That is, data output circuit 114 of memory device 100 does not include a latch to access output data.

In example embodiments, the data (for example, weights) are stored in shift register array 102 by shifting write pointers. In addition, the data is read from shift register array 102 by shifting read pointers. For example, a read address is initialized to a first entry using read driver circuit 104a and a write address is initialized to a last entry using write driver circuit 104b. The read and write addresses are then incremented with each clock cycle using read driver circuit 104a and write driver circuit 104b respectively.

Figure 4A:
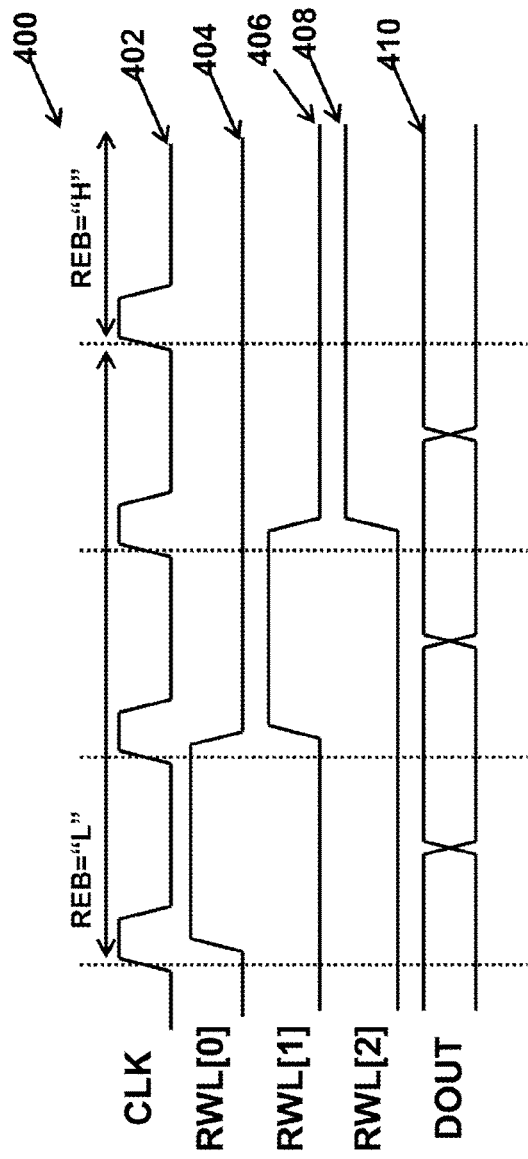
FIG. 4A depicts an example timing diagram of read operation in a memory device in accordance with some embodiments.

FIG. 4A depicts an example timing diagram 400 of a read operation at memory device 100 in accordance with some embodiments. For example, timing diagram 400 shows a clock signal 402, a RWL[0] signal 404, a RWL[1] signal 406, a RWL[2] signal 408, and a DOUT signal 410. Timing diagram 400 shows four cycles of clock signal 402 with each cycle starting with a rising edge of clock signal 402. During the first three cycles, the REB signal is at logic low and for the fourth cycle, the REB signal is at logic high.

As shown in timing diagram 400, RWL[0] signal 404 rises to logic high at a first rise (that is, beginning of the first cycle) of clock signal 402. RWL[0] signal 404 rises subsequently falls to logic low at a second rise (that is, beginning of the second cycle) of clock signal 402. In addition, at the second rise of clock signal 402, RWL[1] signal 406 rises to logic high and subsequently falls to logic low at a third rise (that is, beginning of the third cycle) of clock signal 402. Moreover, at the third rise of clock signal 402, RWL[2] signal 408 rises to logic high and subsequently falls to logic low at a fourth rise (that is, beginning of the fourth cycle) of clock signal 402. DOUT signal 410 provides an output of memory device 100.

Figure 4B:
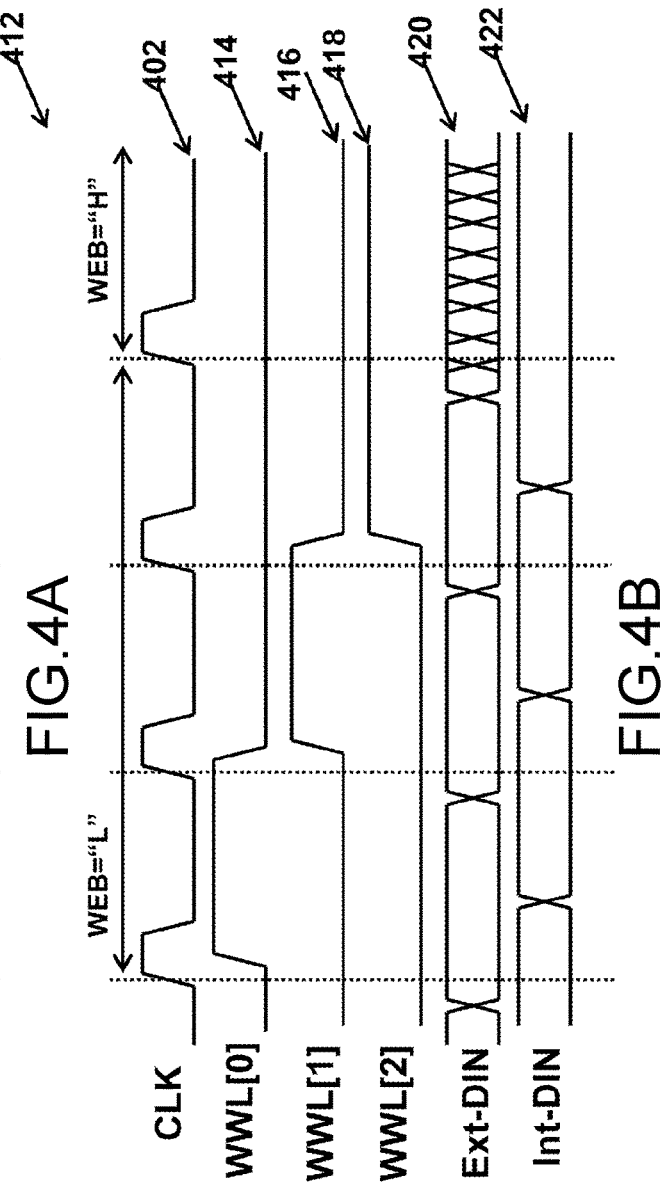
FIG. 4B depicts an example timing diagram of write operation in a memory device in accordance with some embodiments.

FIG. 4B depicts an example timing diagram 410 of a write operation at memory device 100 in accordance with some embodiments. For example, timing diagram 410 shows a clock signal 402, a WWL[0] signal 414, a WWL[1] signal 416, a WWL[2] signal 418, Ext-DIN signal 420, Int-DIN signal 422. Timing diagram 400 shows four cycles of clock signal 402 each cycle starting with a rising edge of clock signal 402. During the first three cycles the WEB signal is at logic low and for the fourth cycle the WEB signal is at logic high.

As shown in timing diagram 410, WWL[0] signal 414 rises to logic high at a first rise (that is, beginning of the first cycle) of clock signal 402. WWL[0] signal 414 rises subsequently falls to logic low at a second rise (that is, beginning of the second cycle) of clock signal 402. In addition, at the second rise of clock signal 402 WWL[1] signal 416 rises to logic high and subsequently falls to logic low at a third rise (that is, beginning of the third cycle) of clock signal 402. Moreover, at the third rise of clock signal 402, WWL[2] signal 418 rises to logic high and subsequently falls to logic low at a fourth rise (that is, beginning of the fourth cycle) of clock signal 402. Ext-DIN signal 420, Int-DIN signal 422 provides an output of memory device 100.

Figure 4C:
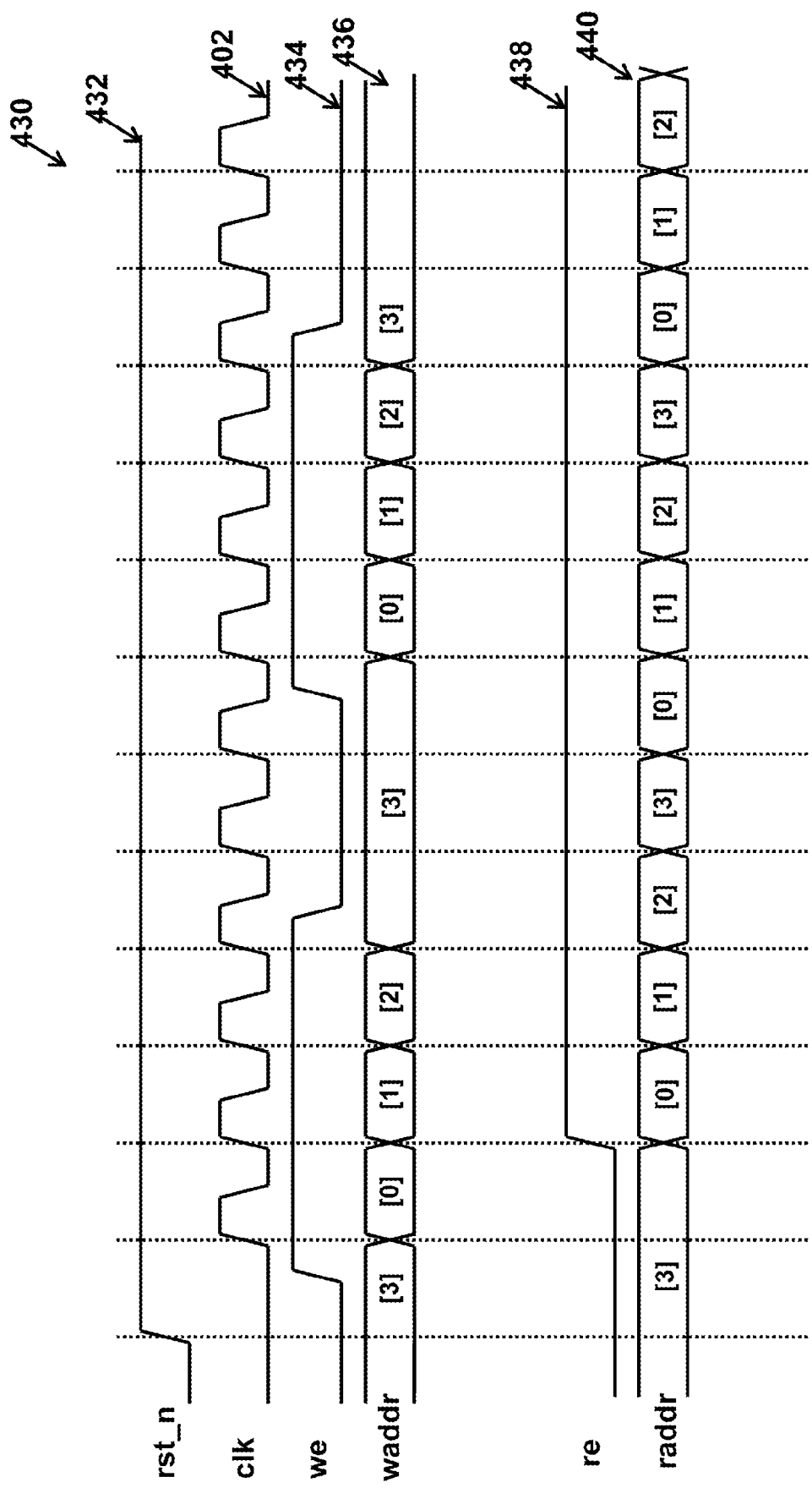
FIG. 4C depicts an example timing diagram of a first clock circuit and a second clock circuit of the memory device in accordance with some embodiments.

FIG. 4C depicts an example timing diagram 430 of the first clock circuit 108 and second clock circuit 110 of memory device 100 in accordance with some embodiments. For example, timing diagram 430 shows a reset signal 432, a clock signal 402, a write enable signal 434, a write address signal 436, a read enable signal 438 and a read address signal 440. As shown in timing diagram 430, write address signal changes at the rise edge of clock signal 402 when both reset signal 432 and write enable signal 434 are high. Similarly, and as shown in timing diagram 430, read address signal changes at the rise edge of clock signal 402 when both reset signal 432 and read enable signal 434 are high.

Memory device 100 may be used in neural network processing. For example, memory device 100 may be used as a dense shift register array for neural network processing.

Neural networks are machine learning models that employ one or more layers of models to generate an output, e.g., a classification, for a received input. For example, given an input, the neural network can compute an inference for the input. The inference is computed by processing the input through layers of the natural network which are arranged in sequence, each with a respective set of weights. Each layer of the models receives an input and processes the input in accordance with the respective set of weights for each of the layer to generate an output. During the processing, output from one layer is provided as an input to the next layer. Hence, memory device 100 may be used for storing the weights because of many iterations with the same weight.

In addition, memory device 100 results in reduction of area of neural network processor due to its smaller size compared to shift register arrays of DFF registers. For example, each DFF register includes twenty four transistors (24T) while the shift registers of the disclosed memory device 100 includes twelve or ten transistors (12T or 10T). In addition, the third plurality of flip-flops of data input circuit 106 may be shared with a defect testing (DFT) circuit further reducing the area of memory device 100.

Figure 5:
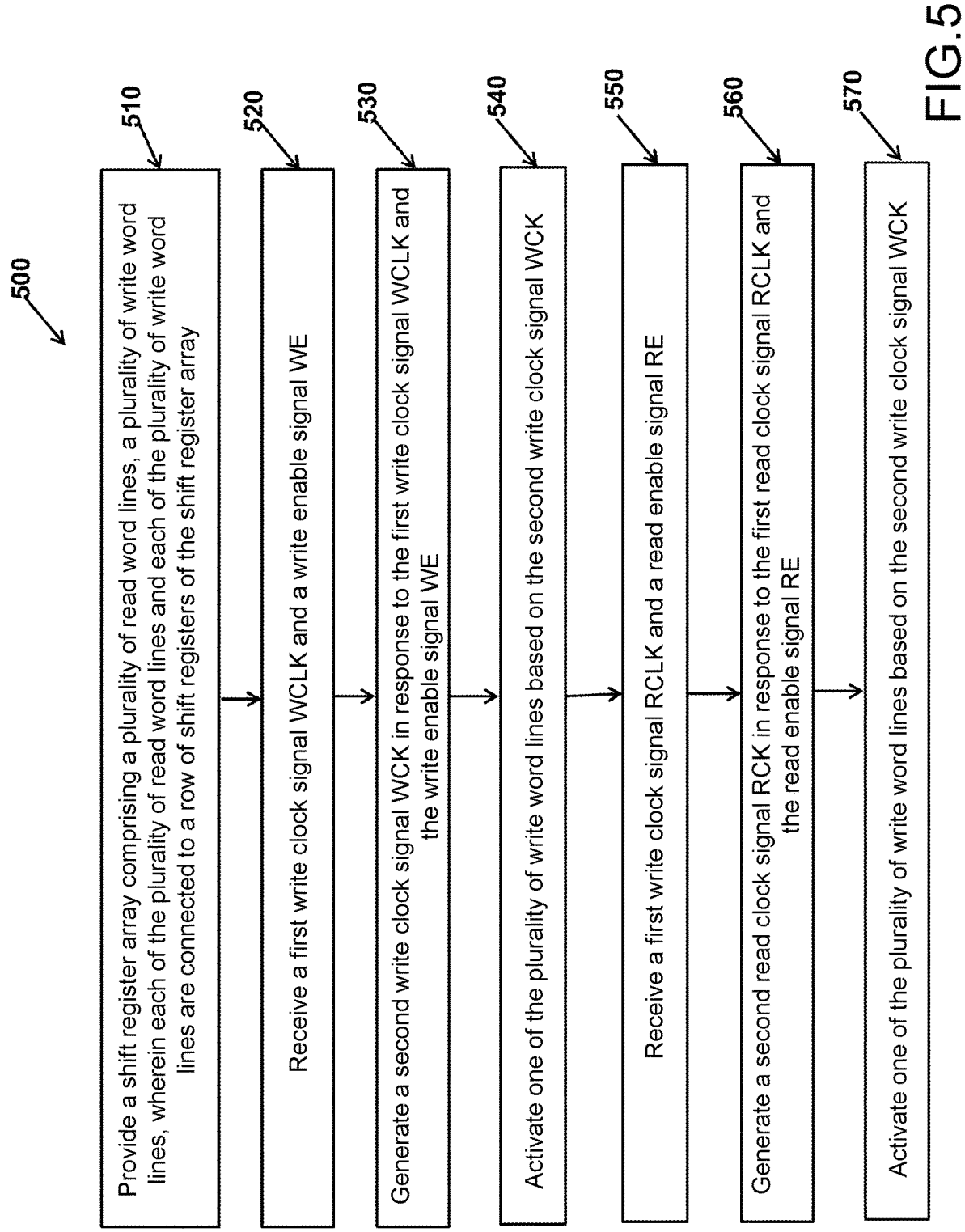
FIG. 5 illustrates an example method for providing a memory device in accordance with some embodiments.

FIG. 5 illustrates an example method for operating memory device 100 in accordance with some embodiments. At block 510 of method 500, a shift register array 102 is provided. Shift register array 102 comprises a plurality of read word lines, a plurality of write word lines, wherein each of the plurality of read word lines and each of the plurality of write word lines are connected to a row of shift registers of the shift register array 102. At block 520 of method 500, a first write clock signal WCLK and a write enable WE signal are received. At block 530 of method 500, a second write clock signal WCK is generated in response to the first write clock signal WCLK and the write enable signal WE. At block 540 of method 500, one of the plurality of write word lines is activated based on the second write clock signal WCK. In example embodiments activating one of the plurality of write word line further comprises shifting selecting of one of the plurality of write word line to a next one of the plurality of write word line with each cycle of the second write clock signal WCK.

At block 550 of method 500, a first read clock signal RCLK and a read enable signal RE are received. At block 560 of method 500, a second read clock signal RCK is generated in response to the first read clock signal RCLK and the read enable signal RE. At block 570 of method 500, a read word line of the plurality of word lines is activated based on the second read clock signal RCK. In example embodiments, activating one of the plurality of read word line further comprises shifting selecting of one of the plurality of read word line to a next one of the plurality of read word line with each cycle of the second read clock signal RCK.

According to example embodiments, a memory device comprises: a shift register array comprising a plurality of shift registers arranged in a matrix of a plurality of rows and a plurality of columns, wherein: each of the plurality of rows comprises a first plurality of shift registers and each of the plurality of columns comprises a second plurality of shift registers; each of the plurality of rows are associated with a read word line and a write word lines; each of the plurality of rows are associated with a data input line and a data output line; and each of the plurality of shift arrays comprises a static random access memory.

In accordance with example embodiments, a memory device comprises a shift register array comprising a plurality of rows and a plurality of columns, wherein each of the plurality of rows are associated with a read word line and a write word lines; and a driver circuit comprising a first cascade of a first plurality of flip-flops and a second cascade of a second plurality of flip-flops, wherein the first cascade is operative to activate the write word line of a selected row of the plurality of rows, and wherein the second cascade is operative to activate a read word line of the selected row of the plurality of rows.

According to example embodiments, a method comprises: providing a shift register array comprising a plurality of read word lines, a plurality of write word lines, wherein each of the plurality of read word lines and each of the plurality of write word lines are connected to a row of shift registers of the shift register array; receiving a first write clock signal WCLK and a write enable WE signal; generating a second write clock signal WCK in response to the first write clock signal WCLK and the write enable signal WE; activating, based on the second write clock signal WCK, one of the plurality of write word lines; receiving a first read clock signal RCLK and a read enable signal RE; generating a second read clock signal RCK in response to the first read clock signal RCLK and the read enable signal RE; and activating, based on the second read clock signal RCK, a read word line of the plurality of word lines.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
    a shift register array comprising a plurality of shift registers arranged in a matrix of a plurality of rows and a plurality of columns, wherein:
        each of the plurality of rows comprises a first plurality of shift registers and each of the plurality of columns comprises a second plurality of shift registers;
        each of the plurality of rows are associated with a read word line and a write word line;
        each of the plurality of columns are associated with a data input line and a data output line; and
        each of the plurality of shift registers comprises a static random access memory; and
    a driver circuit comprising a first cascade of a first plurality of flip-flops and a second cascade of a second plurality of flip-flops, wherein the first cascade is operative to activate the write word line of a selected row of the plurality of rows, and wherein the second cascade is operative to activate a read word line of the selected row of the plurality of rows.

2. The memory device of claim 1, wherein the driver circuit is further operative to charge the activated read word line and the activated write word lined to a logic high.

3. The memory device of claim 1, wherein the first cascade of the first plurality of flip-flops shifts by one position at each transition of a first clock signal.

4. The memory device of claim 3, further comprising a first clock circuit operative to provide the first clock signal.

5. The memory device of claim 1, wherein the second cascade of the second plurality of flip-flops shifts by one position at each transition of a second clock signal.

6. The memory device of claim 5, further comprising a second clock circuit operative to provide the second clock signal.

7. The memory device of claim 1, further comprising an input circuit comprising a third plurality of flip-flops, wherein each of the third plurality of flip-flops are connected to the data input line of one of the plurality of columns.

8. The memory device of claim 1, wherein the static random access memory of each of the plurality of shift registers is operative to store one bit of information.

9. The memory device of claim 1, wherein the static random access memory of the each of the plurality of shift registers include twelve transistors.

10. The memory device of claim 1, wherein the static random access memory of the each of the plurality of shift registers include ten transistors.

11. A memory device comprising:
    a shift register array comprising a plurality of rows and a plurality of columns, wherein each of the plurality of rows comprises a first plurality of shift registers and each of the plurality of columns comprises a second plurality of shift registers, wherein each of the plurality of rows are associated with a read word line and a write word lines; and
    a driver circuit comprising a first cascade of a first plurality of flip-flops and a second cascade of a second plurality of flip-flops, wherein the first cascade is operative to activate the write word line of a selected row of the plurality of rows, and wherein the second cascade is operative to activate a read word line of the selected row of the plurality of rows.

12. The memory device of claim 11, further comprising an input circuit comprising a third plurality of flip-flops, wherein each of the third plurality of flip-flops is connected to input nodes of each of the first plurality of shift registers of a respective column of the shift register array.

13. The memory device of claim 11, further comprising an output circuit connected to output nodes of the first plurality of shift registers of a respective column of the shift register array.

14. The memory device of claim 11, wherein each of the first plurality flip-flops and the second plurality of flip-flops comprises an asynchronous reset.

15. The memory device of claim 11, wherein an output node of one flip-flop is connected to an input node of a next flip-flop in the first cascade, and wherein the output node of a last flip-flop is connected to the input node of the first flip-flop in the first cascade.

16. The memory device of claim 11, wherein a number of the first plurality of flip-flops of the first cascade is equal to a number of rows of the shift register array.

17. A method comprising:
    providing a shift register array comprising a plurality of read word lines and a plurality of write word lines, wherein each of the plurality of read word lines and each of the plurality of write word lines are connected to a row of shift registers of the shift register array;
    receiving a first write clock signal WCLK and a write enable WE signal;
    generating a second write clock signal WCK in response to the first write clock signal WCLK and the write enable signal WE;

activating, by a write driver circuit comprising a first cascade of a first plurality of flip-flops based on the second write clock signal WCK, one of the plurality of write word lines;

receiving a first read clock signal RCLK and a read enable signal RE;

generating a second read clock signal RCK in response to the first read clock signal RCLK and the read enable signal RE; and activating, by a read driver circuit comprising a second cascade of a second plurality of flip-flops based on the second read clock signal RCK, a read word line of the plurality of word lines.

18. The method of claim 17, wherein activating one of the plurality of read word line further comprises shifting one of the plurality of read word line to a next one of the plurality of read word line with each cycle of the second read clock signal RCK.

19. The method of claim 17, wherein activating one of the plurality of write word line further comprises shifting selecting of one of the plurality of write word line to a next one of the plurality of write word line with each cycle of the second write clock signal WCK.

20. The memory device of claim 1, wherein each of the first plurality of flip-flops of the first cascade is associated with the write word line of a corresponding row of the plurality of rows, and wherein each of the second plurality of flip-flops of the second cascade is associated with the read word line of a corresponding row of the plurality of rows.

* * * * *